(12) United States Patent
Takahashi

(10) Patent No.: US 6,869,887 B2
(45) Date of Patent: Mar. 22, 2005

(54) METHOD FOR MANUFACTURING THIN FILM SEMICONDUCTOR DEVICE AND METHOD FOR FORMING RESIST PATTERN THEREOF

(75) Inventor: Mitsuasa Takahashi, Kanagawa (JP)

(73) Assignee: NEC LCD Technologies, Ltd., Kawasaki (JP)

(*) Notice: Subject to any disclaimer, the term of this patent is extended or adjusted under 35 U.S.C. 154(b) by 0 days.

(21) Appl. No.: 10/454,403

(22) Filed: Jun. 4, 2003

(65) Prior Publication Data

US 2003/0224577 A1 Dec. 4, 2003

(30) Foreign Application Priority Data

Jun. 4, 2002 (JP) ........................... 2002-163083

(51) Int. Cl.[7] ............................. H01L 21/302
(52) U.S. Cl. .................. 438/717; 438/736; 438/737; 438/738
(58) Field of Search .................. 438/717, 736–738; 430/3, 322–325

(56) References Cited

U.S. PATENT DOCUMENTS 6,576,374 B1 * 6/2003 Kim .............................. 430/5
6,599,667 B2 * 7/2003 Yusa et al. .................... 430/5

FOREIGN PATENT DOCUMENTS

| JP | 07-321015 | 12/1995 |
| JP | 10-163174 | 6/1998 |
| JP | 11-307780 | 11/1999 |
| JP | 2001-044439 | 2/2001 |

OTHER PUBLICATIONS

Japanese Office Action dated Aug. 4, 2004.

* cited by examiner

*Primary Examiner*—Hsien-Ming Lee
(74) *Attorney, Agent, or Firm*—Katten Muchin Zavis Rosenman

(57) ABSTRACT

A method for manufacturing a thin film semiconductor device is provided which is capable of achieving simplification of manufacturing processes and of improving alignment accuracy without using a plurality of alignment masks. An alignment pattern is formed by using a resist layer having a plurality of regions each having a different film thickness corresponding to each of a plurality of patterns produced using a halftone mask having a halftone exposure region as a photomask and by forming a light transmitting portion to be an aperture pattern and by etching an underlying silicon layer. By having an underlying silicon layer exposed and implanting ions into an entire resist layer, only a main pattern region is doped with the ions.

10 Claims, 4 Drawing Sheets formation of underlying protecting film formation of underlying silicon layer processes of resist coating, exposure and development process of etching processes of ashing and doping ion implantation process of resist coating process of exposure process of development

PROCESS OF DOPING

METHOD OF PREVENTING CONTAMINATION

PROCESS OF EXPOSURE

PROCESS OF DEVELOPMENT

ETCHING PROCESS FOR ALIGNMENT PATTERN

FOR SUBSEQUENT PROCESS

METHOD FOR MANUFACTURING THIN FILM SEMICONDUCTOR DEVICE AND METHOD FOR FORMING RESIST PATTERN THEREOF

BACKGROUND OF THE INVENTION

1. Field of the Invention

The present invention relates to a method for manufacturing a thin film semiconductor device and a method for forming a resist pattern needed in the manufacturing of the thin film semiconductor device and more particularly to the method for manufacturing a thin film semiconductor device and the method for forming the resist pattern needed in the manufacturing of the thin film semiconductor device, whereby it is possible to achieve simplification of the manufacturing processes of the thin film semiconductor device and improving alignment accuracy during the manufacturing processes of the thin film semiconductor device.

The present application claims priority of Japanese Patent Application No. 2002-163083 filed on Jun. 4, 2002, which is hereby incorporated by reference.

2. Description of the Related Art

Conventionally, in a method for manufacturing a thin film semiconductor device and for forming a resist pattern needed in the manufacturing of the thin film semiconductor device, an alignment process is impossible between a process of ion doping in which a pattern is not left on a substrate from which a photoresist (hereinafter may be referred simply to as a resist) has been removed and a subsequent process. Therefore, in such the case, an alignment pattern that has been formed in other processes is commonly used in the subsequent process.

Now, to explain a conventional technology, let it be assumed that, for example, as shown in FIG. 6A, an exposure mask 120 is used to form a light intercepting region 121, an alignment pattern region 122 serving as a light transmitting portion, and an ion doping region 123 on a surface of a resist layer 14.

Here, as shown in the same figure, on a surface of a transparent, insulating glass substrate 11 is formed an insulating film which is made of, for example, silicon dioxide as an underlying (undercoated) protecting film 12. On a surface of the underlying protecting film 12 is formed an underlying silicon layer 13 which is made of amorphous silicon (hereinafter referred simply to as "a-Si"). The resist lay 14 is coated on the underlying silicon layer 13.

After exposure and development operations have been performed in this state assumed above, as shown in FIG. 6B, in the alignment pattern region 122 and the ion doping region 123 other than the light intercepting region 121, the resist layer 14 has been removed by exposure and a resist layer 14(0) is now formed. That is, in the resist layer 14(0) are formed an alignment pattern portion 2 which forms space reaching an underlying silicon layer 13 and which corresponds to the alignment pattern region 122 shown in FIG. 6A, an ion doping portion 3 which forms space reaching the underlying silicon layer 13 and which corresponds to the ion doping region 123 shown in FIG. 6A and a light intercepting pattern portion 1 which corresponds to the light intercepting region 121.

If ion doping operations are performed in this state by using the resist layer 14(0) as a mask, since not only the ion doping portion 3 but also the underlying silicon layer 13 formed below the alignment pattern portion 2 are doped with ion at a same time, an exposed part of the alignment pattern portion 2 comes to have a same material as the ion doping portion 3. Then, when the resist layer 14(0) is removed to perform a subsequent process, optical discrimination between the alignment pattern portion 2 and the ion doping portion 3 becomes impossible and, therefore, an alignment mark cannot be identified.

Therefore, as shown in FIG. 6C, etching operations have to be performed by using not the resist layer 14(0) having a plurality of patterns as the mask but an etching mask 220 having only an alignment pattern region 222 that has been prepared separately. Thus, an alignment pattern 4 is formed on the underlying silicon layer 13 by an etching process. As a result, as shown in FIG. 6D, since the alignment pattern 4 is discriminated among other regions, in a subsequent process, this alignment pattern 4 can be used for positioning by using the resist layer 14(0) as the mask.

Moreover, in the process in which ion doping is first made, by preparing a mask to be used only for forming the alignment mark and by adding a process of forming a photoresist layer 14(0) using the prepared mask, a same state as shown in FIG. 6D can be obtained. That is, since, after the alignment mark has been formed, the process proceeds to a subsequent ion doping step, the photoresist layer 14(0) has to be formed separately and individually in two processes.

Thus, the conventional method for manufacturing the thin film semiconductor device and the conventional method of forming the resist pattern have problems not only in that, when a process such as ion doping has to be performed at a first stage, unnecessary processes are required which include a process of producing the alignment mark by separately preparing an etching mask or of performing main processing by preparing a mask to be used only for positioning with the alignment mark in a subsequent process but also in that indirect alignment for a subsequent process causes lowering in adjustment accuracy.

SUMMARY OF THE INVENTION

In view of the above, it is an object of the present invention to provide a method for manufacturing a thin film semiconductor device and for forming a resist pattern needed in the manufacturing of the thin film semiconductor device which is capable of achieving simplification of manufacturing processes and of improving alignment accuracy during the manufacturing processes without using a plurality of alignment masks.

According to a first aspect of the present invention, there is provided a method for manufacturing a thin film semiconductor device including:

a process of forming an underlying silicon layer on a surface of a substrate;

a process of forming, using a photomask having a halftone region, on a surface of the underlying silicon layer, a plurality of resist regions each having a different film thickness as a resist pattern and each corresponding to each of a plurality of patterns each being different from one another;

at least one process of removing, when an underlying layer is exposed, a resist region having a least film thickness in the resist pattern, a process of forming an alignment pattern on the underlying silicon layer by etching a first aperture pattern using the resist pattern as a mask, and a process of forming patterns other than the alignment pattern using a resist pattern after removing the resist region having the least film thickness as a mask.

In the foregoing first aspect, a preferable mode is one wherein a process other than that of forming the alignment pattern on the underlying silicon layer includes a process of fabrication, using the resist pattern as a mask, by employing a method other than an etching method.

Another preferable mode is one wherein a process other than a process of forming an alignment pattern on the underlying silicon layer includes a process of ion implantation using the resist pattern as a mask.

Still another preferable mode is one wherein a process other than that of forming an alignment pattern on the underlying silicon layer includes a process of etching using the resist pattern as a mask.

An additional preferable mode is one wherein a transparent insulating substrate is used as the substrate.

A furthermore preferable mode is one wherein an alignment pattern is formed as the resist pattern being formed on the surface of the underlying silicon layer so as to be an aperture pattern.

According to a second aspect of the present invention, there is provided a method for manufacturing a thin film semiconductor device including:

a process of forming an underlying silicon layer on a surface of a substrate;

a process of forming, using a photomask having a halftone region, on a surface of the underlying silicon layer, a plurality of resist regions each having a different film thickness as a resist pattern and each corresponding to each of a plurality of patterns each being different from one another;

at least one process of removing, when an underlying layer is exposed, a resist region having a least film thickness in the resist pattern by an ashing method, a process of forming an alignment pattern on the underlying silicon layer by etching a first aperture pattern using the resist pattern as a mask, and a process of forming patterns other than the alignment pattern using a resist pattern after performing the ashing method as a mask.

In the foregoing second aspect, a preferable mode is one wherein a process other than that of forming the alignment pattern on the underlying silicon layer includes a process of fabrication, using the resist pattern as a mask, by employing a method other than an etching method.

Another preferable mode is one wherein a process other than a process of forming an alignment pattern on the underlying silicon layer includes a process of ion implantation using the resist pattern as a mask.

Still another preferable mode is one wherein a process other than that of forming an alignment pattern on the underlying silicon layer includes a process of etching using the resist pattern as a mask.

An additional preferable mode is one wherein a transparent insulating substrate is used as the substrate.

A furthermore preferable mode is one wherein an alignment pattern is formed as the resist pattern being formed on the surface of the underlying silicon layer so as to be an aperture pattern.

According to a third aspect of the present invention, there is provided a method for forming a resist pattern on a surface of an underlying silicon layer formed on a surface of a substrate including:

a process of forming a resist layer by coating with a photoresist;

a process of forming an alignment pattern portion, a main pattern portion used in a subsequent process following formation of the alignment pattern portion, a light transmitting mask region, a halftone exposure region, and a light intercepting region on a photomask used for formation of a pattern on the resist layer; and a process of performing an exposure operation on the formed resist layer using the photomask and performing a development operation to produce a plurality of resist regions each having a different thickness and at least one resist-removed region.

In the foregoing third aspect, a preferable mode is one wherein the at least one resist-removed region is produced by the light transmitting mask region so as to be an aperture pattern.

With the above configurations, an alignment pattern can be formed by using a resist layer portion having a least film thickness produced by utilizing, as a photomask, a halftone mask having a halftone region and by performing an etching process on the resist layer portion.

Moreover, since two or more photoresist producing processes can be unified, simplification of the manufacturing processes is achieved and since positional adjustment of a plurality of photoresists is not required, alignment accuracy can be improved more.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 2A:
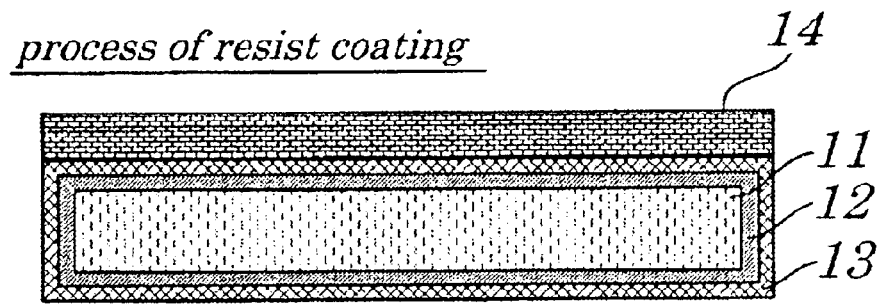
FIGS. 2A to 2C are diagrams for illustrating in detail the manufacturing process shown in FIG. 1C according to the first embodiment of the present invention.
Figure 2B:
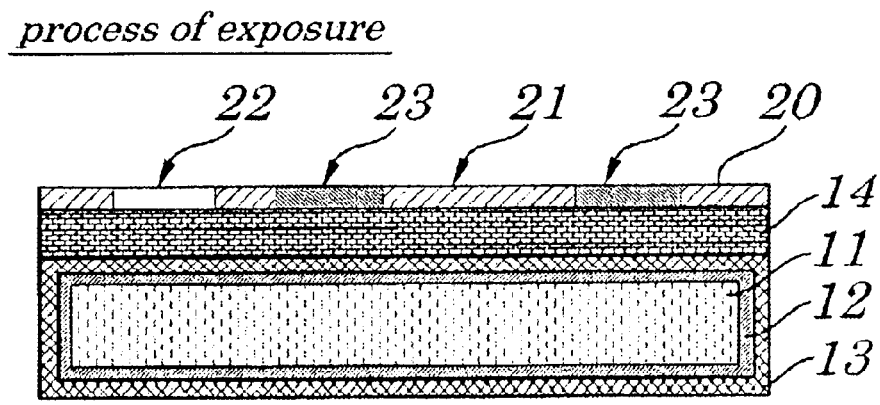
Figure 2C:
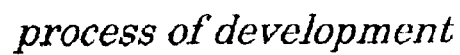
Figure 2C:
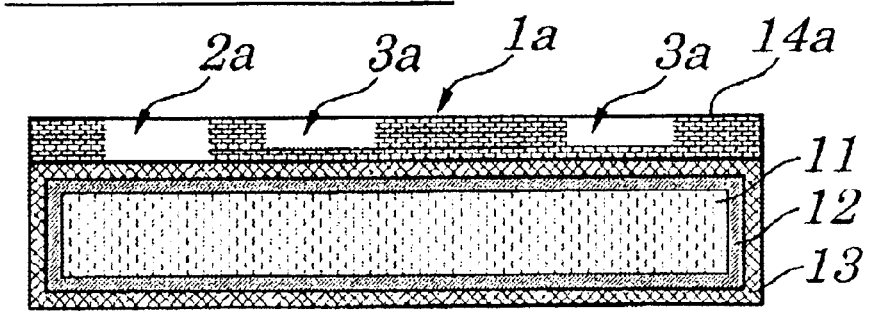
Figure 3:
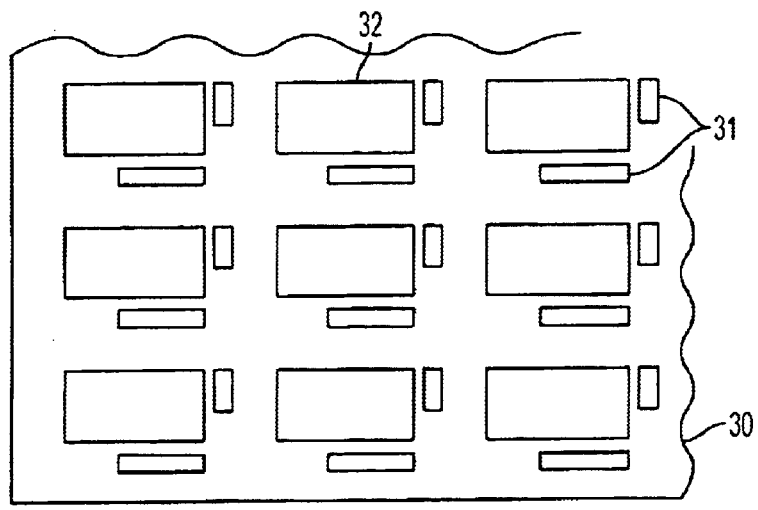
FIG. 3 is a plan view of the thin film semiconductor device of the first embodiment of the present invention.

FIGS. 1A to 1E are cross-sectional views of a thin film semiconductor device illustrating manufacturing processes according to a first embodiment of the present invention. FIGS. 2A to 2C are diagrams for illustrating, in detail, the manufacturing process shown in FIG. 1C according to the first embodiment. FIG. 3 is a plan view of a substrate of the thin film semiconductor device of the first embodiment of the present invention. As shown in FIG. 3, alignment pattern portions 31 are placed on an upper surface of a substrate 30 in order to achieve positioning on the upper surface of the substrate 30 in a manner that one of corners of transistor forming regions 32 is put between the alignment pattern portions 31.

Figure 1A:
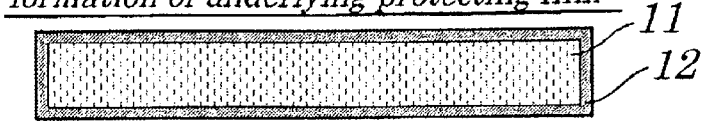
FIGS. 1A to 1E are cross-sectional views of a thin film semiconductor device illustrating manufacturing processes according to a first embodiment of the present invention.
Figure 1B:
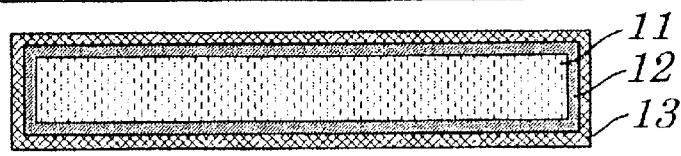

In the method for manufacturing the thin film semiconductor device shown in FIG. 1A, an insulating film made of, for example, silicon dioxide having a thickness of about 3000 angstroms as an underlying (undercoated) protecting film 12 is formed on a surface of a transparent, insulating glass substrate 11. Next, as shown in FIG. 1B, an underlying silicon layer 13 made of a-Si having a thickness of about 600 angstroms is formed on a surface of the underlying protecting film 12 by an LP-CVD (Low Pressure-Chemical Vapor Deposition) or a PE-CVD (Plasma Enhanced-CVD) method. The a-Si serving as the underlying silicon layer 13, after having been formed on the surface of the underlying protecting film 12, is dehydrogenated so as to have a hydrogen content of 1% or less.

Figure 1C:
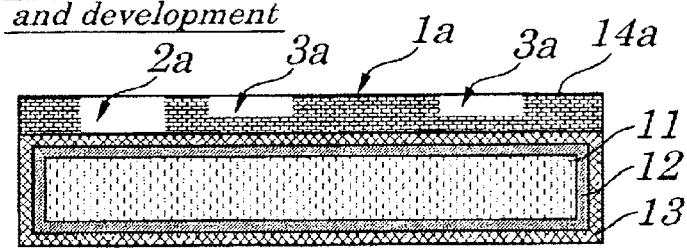

Now, a method of forming a resist layer 14a shown in FIG. 1C is described by referring to FIGS. 2A, 2B, and 2C.

First, as shown in FIG. 2A, a resist layer 14 with a thickness of about 2 μm is coated on an upper surface of the underlying silicon layer 13 shown in FIG. 1B. Then, as shown in FIG. 2B, an exposure process is performed using a halftone mask 20. That is, the halftone mask 20 includes a light intercepting mask portion 21 where an original thickness of the resist layer 14 is maintained after the exposure process has been performed, a light transmitting mask portion 22 where no resist layer 14 is left after the exposure process has been performed, and a semi-transparent (hereinafter called "halftone") mask portion 23 where a predetermined thickness of the resist layer 14 is left, that is, for example, an intermediate thickness of the resist layer 14 is left after the exposure process has been performed.

The light transmitting mask portion 22 shown in FIG. 2B is used to form the alignment pattern portions 31 shown in FIG. 3. Moreover, the halftone mask portion 23 shown in FIG. 2B is used to perform an ion doping operation on the transistor forming region 32 shown in FIG. 3.

After processes of exposure and development have been completed, as shown in FIG. 2C, since unwanted portions of the resist layer 14 are removed by being exposed, a resist layer 14a with three levels of film thickness is formed. That is, the resist layer 14a includes a light intercepting pattern portion 1a where an original thickness of the resist layer 14 is maintained, a light transmitting pattern portion 2a where no resist layer 14 is left, and a halftone pattern portion 3a where a predetermined thickness of the resist layer 14 is left.

A thickness of the resist layer 14a left in the halftone pattern portion 3a on which a halftone exposure operation has been performed, though being different depending on process conditions being employed, is preferably 3000 angstroms or more in the case of dry etching and 1000 angstroms or more in the case of wet etching.

By referring again to FIGS. 1A to 1E, the method for manufacturing the thin film semiconductor device is further described. The thin film semiconductor device shown in FIG. 1C has the same cross-sectional configurations that the semiconductor device shown in FIG. 2C has which has been produced by the processes described above by referring to FIGS. 2A to 2C.

Figure 1D:
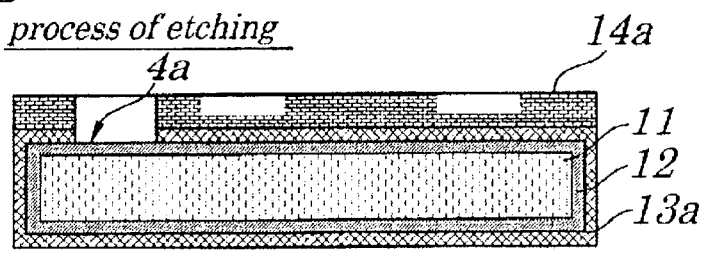

Then, as shown in FIG. 1D, dry-etching operations are performed, using the resist layer 14a as a mask, on the underlying silicon layer 13 which has been exposed only in the light transmitting pattern portion 2a in the resist layer 14a. As a result, the underlying silicon layer 13 is formed to be a underlying silicon layer 13a with an alignment pattern 4.

Figure 1E:
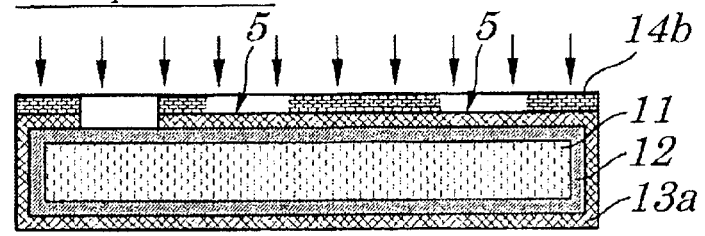

Next, as shown in FIG. 1E, an ion implanting operation or an ion doping operation, using a boron ion to be used for controlling of a threshold of, for example, an N-channel transistor, is performed on an exposed portion of the underlying silicon layer 13a in a main pattern region 5 where a film thickness of the resist layer 14a has been reduced as a whole by an ashing process and the resist layer 14a in the halftone pattern portion 3a has been removed. Lastly, by removing a resist 14b, formation of both the alignment mark 4 to be used in a subsequent process and the main pattern region 5 into which boron is selectively introduced can be achieved in one mask process.

In the above descriptions, the dry-etching and formation of the channel region of the N-channel transistor are explained. However, it is needless to say that, instead of the dry-etching, wet-etching may be also employed and that selective introduction of an impurity into a channel region of a P-channel transistor, instead of the N-channel transistor, is possible. Moreover, the present invention is not limited to a process of selectively introducing impurities of transistors and can be applied to the process of selectively introducing impurities of all devices that require introduction of impurities. Also, the halftone mask portion is formed in a halftone pattern portion and can be applied not only to a doping process but also to a second etching process. Furthermore, in the above embodiment, the a-Si is used as a material for the underlying silicon layer, however, polycrystal silicon may be also used, instead of the a-Si.

Figure 4:
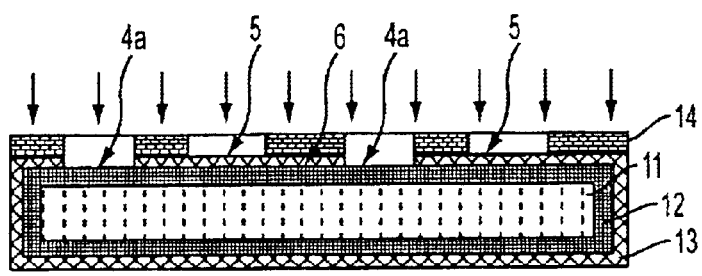
FIG. 4 is a diagram illustrating a process in which simultaneous formation of an alignment pattern and a pattern for an island region is achieved according to the first embodiment of the present invention.

Next, simultaneous formation of both an alignment pattern and a pattern for an island region is described by referring to FIG. 4. In the above embodiment, the present invention is applied to the process of forming an alignment pattern needed for the following process and to the process of selectively introducing an impurity. However, the present invention enables simultaneous formation of a pattern for alignment and a pattern for an island region 6 can be also achieved. That is, as shown in FIG. 4, since the alignment patterns 4 and a pattern for the island region 6 can be formed at a same time, three processes including formation of an alignment mark, formation of a pattern for the island region, and formation of a pattern for doping can be achieved by performing only one photoresist coating process.

Second Embodiment

Figure 5:
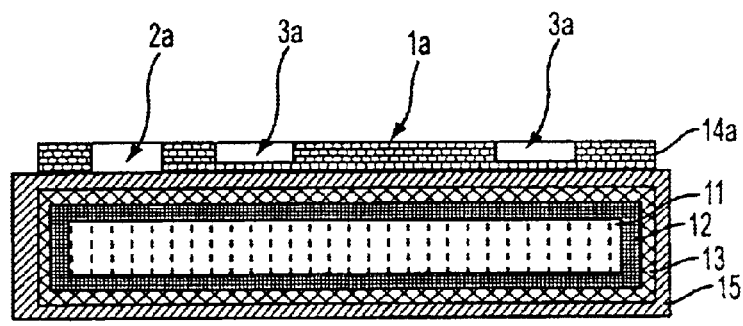
FIG. 5 is a diagram illustrating one example of a process in which contamination of an underlying silicon layer is prevented according to a second embodiment of the present invention.
Figure 6A:
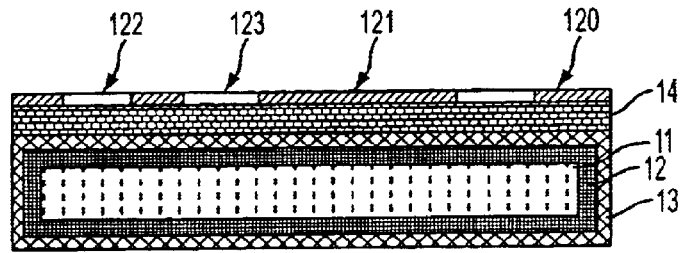
FIGS. 6A to 6D are cross-sectional views of a conventional thin film semiconductor device to explain a manufacturing process.
Figure 6B:
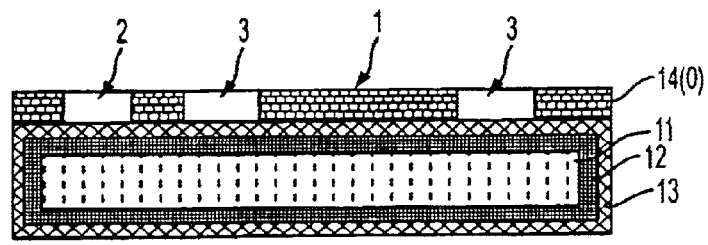
Figure 6C:
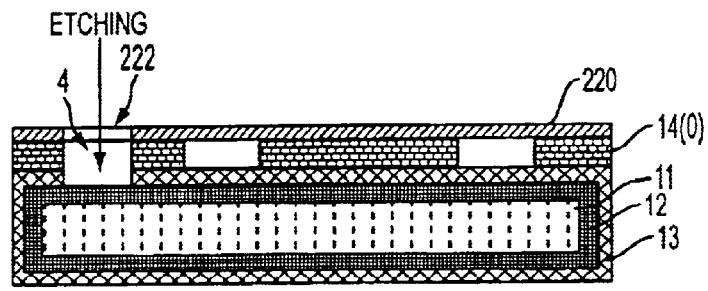
Figure 6D:
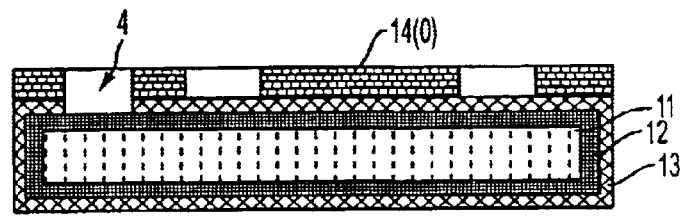

FIG. 5 is a diagram illustrating one example of a process in which contamination of an underlying silicon layer is prevented according to a second embodiment.

As shown in FIG. 5, an oxide film 15 made of silicon dioxide with a thickness of about 1000 angstroms is formed, by using an LP-CVD or PE-CVD, on a surface of a underlying silicon layer 13, formed on a glass substrate 11 as shown in FIG. 5 and in FIG. 1B. By forming the oxide film 15 on the underlying silicon layer 13, contamination of the underlying silicon layer 13 by a resist layer 14a can be prevented.

It is apparent that the present invention is not limited to the above embodiments but may be changed and modified without departing from the scope and spirit of the invention. For example, in the above description, the resist layer is formed so as to be three-layered. However, by forming a halftone region in a photomask so as to be multi-layered, the resist layer can be four-layered or more.

What is claimed is:

1. A method for manufacturing a thin film semiconductor device comprising the steps of:

forming an underlying silicon layer on a surface of a substrate;

forming on a surface of said underlying silicon layer using a photomask having a halftone region, a resist pattern comprising a resist-removed region and a plurality of kinds of resist regions each being different from each other in thickness;

forming an alignment pattern on said underlying silicon layer by etching said resist-removed region using said resist pattern as a mask;

removing a kind of the resist region having a smallest film thickness in said resist pattern to expose an underlying layer, and forming another pattern different from said alignment pattern using a remaining resist pattern as a mask after removing said kind of resist region having said smallest film thickness.

2. The method for manufacturing the thin film semiconductor device according to claim 1, wherein the step of forming said another pattern different from said alignment pattern on said underlying silicon layer includes a step of ion implantation using said remaining resist pattern as a mask.

3. The method for manufacturing the thin film semiconductor device according to claim 1, wherein the step of forming said another pattern different from said alignment pattern on said underlying silicon layer includes a step of etching using said remaining resist pattern as a mask.

4. The method for manufacturing the thin film semiconductor device according to claim 1, wherein a transparent insulating substrate is used as said substrate.

5. A method for manufacturing a thin film semiconductor device comprising the steps of:

forming an underlying silicon layer on a surface of a substrate;

forming, on a surface of said underlying silicon layer, using a photomask having a halftone region, a resist pattern comprising a resist-removed region and a plurality of kinds of resist regions each being different from each other in thickness;

forming an alignment pattern on said underlying silicon layer by etching said resist-removed region using said resist pattern as a mask;

removing a kind of the resist region having a smallest film thickness in said resist pattern by an ashing method to expose an underlying layer, and forming another pattern different from said alignment pattern using a remaining resist pattern as a mask after removing said kind of resist region having said smallest film thickness by performing said ashing method.

6. The method for manufacturing the thin film semiconductor device according to claim 5, wherein the step of forming said another pattern different from said alignment pattern on said underlying silicon layer includes a step of ion implantation using said remaining resist pattern as a mask.

7. The method for manufacturing the thin film semiconductor device according to claim 5, wherein the step of forming said another pattern different from said alignment pattern on said underlying silicon layer includes a step of etching using said remaining resist pattern as a mask.

8. The method for manufacturing the thin film semiconductor device according to claim 5, wherein a transparent insulating substrate is used as said substrate.

9. A method for forming a resist pattern on a surface of an underlying silicon layer formed on a surface of a substrate comprising the steps of:

forming a resist layer by coating with a photoresist;

forming an alignment pattern portion, a main pattern portion used in a subsequent process following formation of said alignment pattern portion, a light transmitting mask region, a halftone exposure region, and a light intercepting region on a photomask used for formation of a pattern on said resist layer; and performing an exposure operation on the formed resist layer using said photomask and performing a development operation to produce a plurality of resist regions each having a different thickness and at least one resist-removed region.

10. The resist pattern forming method according to claim 9, wherein said at least one resist-removed region is produced by said light transmitting mask region as an aperture pattern.

* * * * *